(12) United States Patent
Tomishima et al.

(10) Patent No.: US 9,934,082 B2
(45) Date of Patent: Apr. 3, 2018

(54) APPARATUS AND METHOD FOR DETECTING SINGLE FLIP-ERROR IN A COMPLEMENTARY RESISTIVE MEMORY

(71) Applicant: Intel Corporation, Santa Clara, CA (US)

(72) Inventors: Shigeki Tomishima, Portland, OR (US); Charles Augustine, Hillsboro, OR (US); Wei Wu, Portland, OR (US); Shih Lien L. Lu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/374,922

(22) Filed: Dec. 9, 2016

(65) Prior Publication Data

US 2017/0153933 A1    Jun. 1, 2017

Related U.S. Application Data

(63) Continuation of application No. 14/637,297, filed on Mar. 3, 2015, now Pat. No. 9,529,660.

(51) Int. Cl.
*G11C 7/02* (2006.01)
*G06F 11/07* (2006.01)
(Continued)

(52) U.S. Cl.
CPC ............ *G06F 11/073* (2013.01); *G06F 3/064* (2013.01); *G06F 3/0619* (2013.01); *G06F 3/0679* (2013.01); *G06F 11/079* (2013.01); *G06F 11/0751* (2013.01); *G06F 11/0793* (2013.01); *G06F 11/1048* (2013.01); *G06F 11/1076* (2013.01); *G11C 11/1655* (2013.01); *G11C 11/1659* (2013.01); *G11C 11/1673* (2013.01); *G11C 13/0004* (2013.01); *G11C 13/004* (2013.01); *G11C 13/0007* (2013.01); *G11C 13/0011* (2013.01); *G11C 29/42* (2013.01); *G11C 29/52* (2013.01); *H03M 13/1575* (2013.01); *H03M 13/373* (2013.01); (Continued)

(58) Field of Classification Search
None
See application file for complete search history.

(56) References Cited

U.S. PATENT DOCUMENTS

| 5,267,204 | A | 11/1993 | Ashmore, Jr. |
| 7,126,869 | B1 | 10/2006 | Chou |

(Continued)

OTHER PUBLICATIONS

Non-Final Office Action dated Mar. 24, 2017 for U.S. Appl. No. 15/187,646.
Restriction Requirement dated Jan. 25, 2017 for U.S. Appl. No. 15/187,646.
Non-Final Office Action for U.S. Appl. No. 14/637,297 dated Mar. 14, 2016, 19 pages.
Notice of Allowance for U.S. Appl. No. 14/637,297 dated Aug. 31, 2016, 8 pages.

(Continued)

*Primary Examiner* — Harry W Byrne
*Assistant Examiner* — Sultana Begum
(74) *Attorney, Agent, or Firm* — Green, Howard & Mughal LLP

(57) ABSTRACT

Described is an apparatus which comprises: a complementary resistive memory bit-cell; a first sense amplifier coupled to the complementary resistive memory bit-cell via access devices; a second sense amplifier coupled to the first sense amplifier and to the complementary resistive memory bit-cell via the access devices, wherein the second sense amplifier is operable to detect an error in the complementary resistive memory bit-cell.

19 Claims, 7 Drawing Sheets

(51) Int. Cl.
| | |
|---|---|
| G11C 13/00 | (2006.01) |
| G11C 11/16 | (2006.01) |
| G11C 29/42 | (2006.01) |
| G11C 29/52 | (2006.01) |
| G06F 3/06 | (2006.01) |
| G06F 11/10 | (2006.01) |
| H03M 13/15 | (2006.01) |
| H03M 13/37 | (2006.01) |
| H03M 13/00 | (2006.01) |

(52) U.S. Cl.
CPC .. *G11C 2013/0042* (2013.01); *G11C 2213/79* (2013.01); *G11C 2213/82* (2013.01); *H03M 13/6502* (2013.01)

(56) References Cited

U.S. PATENT DOCUMENTS

| | | | |
|---|---|---|---|
| 8,085,584 | B1 | 12/2011 | Kale et al. |
| 2006/0067104 | A1 | 3/2006 | Hsu |
| 2007/0014160 | A1 | 1/2007 | Kobernik et al. |
| 2009/0161442 | A1 | 6/2009 | New et al. |
| 2011/0255359 | A1 | 10/2011 | Sachdev et al. |
| 2013/0148443 | A1 | 6/2013 | Hold |
| 2013/0272059 | A1* | 10/2013 | Lin ............... G11C 11/161 365/158 |
| 2013/0301345 | A1 | 11/2013 | Noguchi et al. |
| 2014/0071740 | A1 | 3/2014 | Kim et al. |
| 2015/0364178 | A1 | 12/2015 | Kim et al. |

OTHER PUBLICATIONS

Notice of Allowance for U.S. Appl. No. 14/638,942, dated Feb. 11, 2016.
Augustine, C. et al., U.S. Appl. No. 14/638,942, filed Mar. 4, 2015.
Augustine, C. et al., "Numerical Analysis of Typical STT-MTJ Stacks for 1T-1R Memory Arrays", International Electron Devices Meeting (IEDM) 2010. (4 pages).
Azizi, N. et al., "Low-Leakage Asymmetric-Cell SRAM", Proc. Int',l Symp. Low-Power Electronics and Design (ISLPED 02), ACM Press, 2002, pp. 48-51. IEEE Transaction on very Large Scale Integration (VLSI) Systems, vol. 11, No. 4, Aug. 2003, pp. 701-715 (15 pages).
Noguchi, H. et al., "Highly Reliable and Low-Power Nonvolatile Cache Memory with Advanced Perpendicular STT-MRAM for High-Performance CPU", IEEE, VLSI Circuits Digest of Technical Papers, 2014 Symposium on VLSI Circuits Digest of Technical Papers, Jun. 2014. (2 pages).
Ricketts, A. et al., "Investigating the impact of NBTI on different power saving cache strategies", IEEE Design, Automation & Test in Europe Conference & Exhibition, Mar. 8-10, 2010, pp. 592-597 (6 pages).
Zhang, C. et al., "Low Static-Power Frequent-Value Data Caches", Design, Automation and Test in Europe Conference and Exhibition, 2004. Proceedings, vol. 1, Feb. 16-20, 2004 (6 pages).
Notice of Allowance dated Jul. 14, 2017 for U.S. Appl. No. 15/187,646.

* cited by examiner

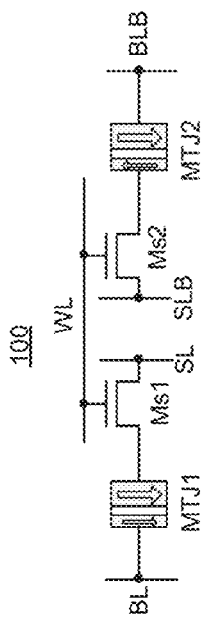

| Initial state of the memory cell | Possible final state of the memory cell | Probability of the final state | Value read from the memory cell |
|---|---|---|---|
| Value = 0<br>MTJ1 – P<br>MTJ2 – AP | MTJ1 – P<br>MTJ2 – AP | $(1-p)^2$ | Value = 0 |
| | MTJ1 – AP<br>MTJ2 – AP | $p(1-p)$ | Value = undefined |
| | MTJ1 – P<br>MTJ2 – P | $(1-p)p$ | Value = undefined |
| | MTJ1 – AP<br>MTJ2 – P | $(p)^2$ | Value = 1 |
| Value = 1<br>MTJ1 – AP<br>MTJ2 – P | MTJ1 – AP<br>MTJ2 – P | $(1-p)^2$ | Value = 1 |
| | MTJ1 – P<br>MTJ2 – P | $p(1-p)$ | Value = undefined |
| | MTJ1 – AP<br>MTJ2 – AP | $(1-p)p$ | Value = undefined |
| | MTJ1 – P<br>MTJ2 – AP | $(p)^2$ | Value = 0 |

APPARATUS AND METHOD FOR DETECTING SINGLE FLIP-ERROR IN A COMPLEMENTARY RESISTIVE MEMORY

CLAIM FOR PRIORITY

This application is a continuation of U.S. patent application Ser. No. 14/637,297, filed on 3 Mar. 2015, entitled "APPARATUS AND METHOD FOR DETECTING SINGLE FLIP-ERROR IN A COMPLEMENTARY RESISTIVE MEMORY," which issues as U.S. Pat. No. 9,529,660, on 27 Dec. 2016, and which is incorporated by reference in entirety.

BACKGROUND

A complementary Magnetic Tunneling Junction (MTJ) device can provide larger sensing margin than a single MTJ bit-cell based device. However, complementary MTJ based memory bit-cells may suffer from uncertain read issues when retention error occurs upon a read mode. Retention error generally refers to an error when one of the MTJs in the complementary MTJ based memory bit-cell is flipped resulting in a conflicting sensing mode with two MTJs storing the same values.

One way to solve this issue is to employ a second read mode (also referred to as the "Salvage Mode"), which identifies the confliction by reading the two MTJs (of the complementary MTJ bit-cell) separately. However, the second read mode requires complicated reading logic which increases reading latency.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates a complementary Magnetic Tunneling Junction (MTJ) memory bit-cell.

FIG. 1B illustrates a truth table of the complementary MTJ memory bit-cell of FIG. 1A.

FIG. 2 illustrates a table with possible states of a complementary MTJ memory-cell for storing '0 and '1 and their probabilities with a given MTJ failure probability.

DETAILED DESCRIPTION

Figure 3:
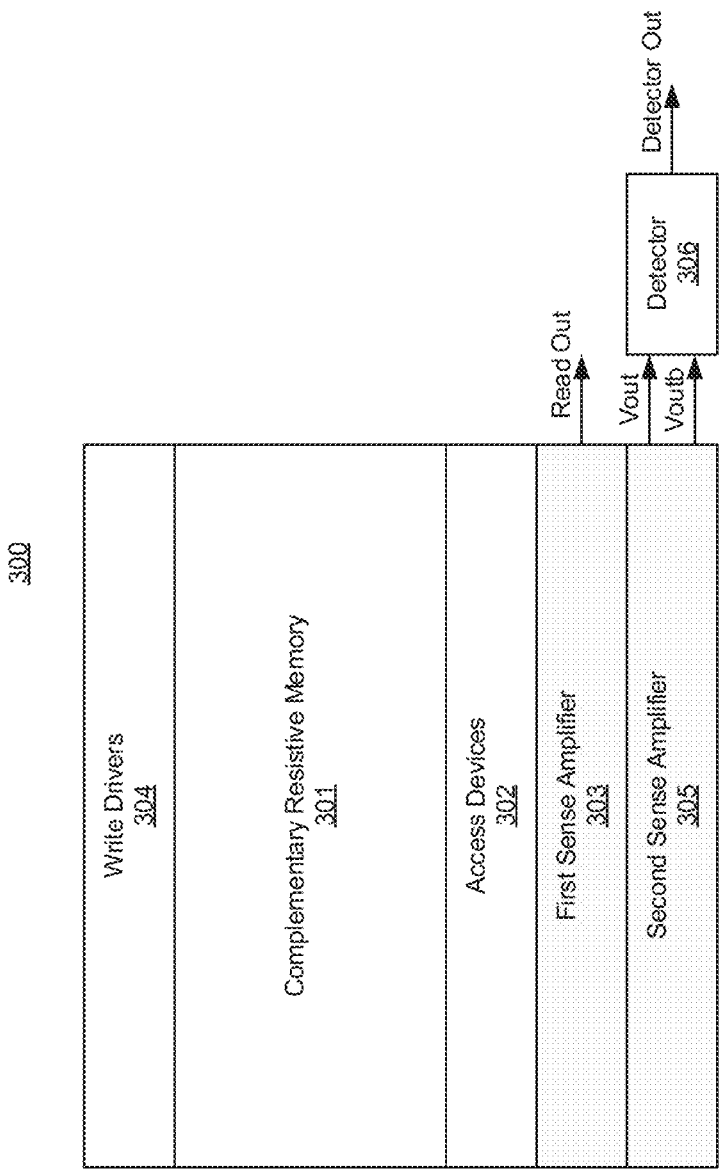
FIG. 3 illustrates a high level memory architecture to detect single flip-error in a complementary resistive memory, according to some embodiments of the disclosure.

Several new types of solid-state, high-density, non-volatile memories store information using a memory element with a variable resistance. For example, the resistance of spin transfer torque (STT)—magnetic random access memory (MRAM) depends on the relative magnetization polarities of two magnetic layers. Other types of resistive memories include resistive RAM (ReRAM) and conductive bridging RAM (CBRAM), whose resistances depend on the formation and elimination of conduction paths through a dielectric or an electrolyte. There is also phase change memory (PCM), for which the resistivity of a cell depends on the crystalline or amorphous state of a chalcogenide. Although the underlying memory element for these (and possibly other) resistive memory technologies may vary, methods for writing to and reading from them can be electrically similar and are encompassed by various embodiments of the present disclosure.

Some embodiments describe an apparatus which comprises a complementary resistive memory bit-cell and a first sense amplifier coupled to the complementary resistive memory bit-cell via access devices. In some embodiments, the apparatus includes a second sense amplifier coupled to the first sense amplifier and to the complementary resistive memory bit-cell via the access devices, where the second sense amplifier detects an error in the complementary resistive memory bit-cell. The location of the error is then used by an errors-and-erasures decoding process to improve the probability to correct the error. In some embodiments, the second sense amplifier is operable to detect and output whether the first amplifier could sense and amplify successfully or not, simultaneously (e.g., substantially at the same time as the first amplifier is sensing the bit-lines).

By incorporating the changes of various embodiments, read-latency and read-power consumption are reduced. In existing solutions, circuits cannot identify which one of the MTJs in a STT-RAM cell fails. Hence, the sense-amplifier of existing solutions can fail and may need to perform individual reading of two MTJs in the complementary bit-cells, which is called "Salvage Mode," and it results in 2× larger read-latency and correspondingly more read power. In some embodiments, dual reading of the same complementary bit-cell is eliminated.

Various embodiments described here also improve the sequence/flow of error correction. In the existing solutions, memory cells with one failed MTJ may be overlooked during normal read mode when their read value happens to be the same as the original written value. Such oversight causes errors to accumulate silently and leads to uncorrectable errors. In some embodiments, these faulty cells are identified during the read mode. In some embodiments, the read mode is a single read mode. In such embodiments, silent corruption is eliminated. In some embodiments, information about the location of the faulty cells is used to improve error correction. For example, an errors-and-erasures based correction scheme is used to improve error correction.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct physical, electrical or wireless connection between the things that are connected, without any intermediary devices. The term "coupled" means either a direct electrical or wireless connection between the things that are connected or an indirect electrical or wireless connection, for example, through one or more passive or active intermediary devices. The term "circuit" means one or more passive and/or active components that are arranged to cooperate with one another to provide a desired function. The term "signal" means at least one current signal, voltage signal, magnetic signal, electromagnetic signal, or data/clock signal. The meaning of "a," "an," and "the" include plural references. The meaning of "in" includes "in" and "on."

The terms "substantially," "close," "approximately," "near," and "about," generally refer to being within +/−20% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors in various circuits and logic blocks described here are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1A illustrates complementary MTJ memory bit-cell 100. Complementary bit-cell 100 consists of two bit-cells, where each bit-cell includes a source transistor coupled in series to an MTJ device. For example, the bit-cell to the left includes MTJ1 device which is coupled in series to an n-type source transistor Ms1, where one layer of the MTJ1 device is coupled to a bit-line (BL), the gate terminal of transistor Ms1 is coupled to a word-line (WL), the source/drain terminal of transistor Ms1 is coupled to a source-line (SL), and the drain/source terminal of transistor Ms1 is coupled to another terminal of the MTJ1 device. Likewise, the bit-cell to the right includes MTJ2 device which is coupled in series to an n-type source transistor Ms2, where one layer of the MTJ2 device is coupled to a complementary bit-line (BLB), the gate terminal of transistor Ms2 is coupled to the WL, the source/drain terminal of transistor Ms2 is coupled to a complementary source-line (SLB), and the drain/source terminal of transistor Ms2 is coupled to another terminal of the MTJ2 device.

Here, the term "complementary bit-line" refers to a bit-line that behaves electrically opposite to the "bit-line" during write operation. For example, when BL is a logic high, then BLB is a logic low and vice versa during write operation, where BLB is the complementary bit-line. Likewise, the term "complementary source-line" refers to a source-line that behaves electrically opposite to the "source-line" during write mode. For example, when SL is logic high, then SLB is logic low and vice versa during write mode, where SLB is the complementary source-line. During read operation, SL and SBL are forced to ground, in accordance to some embodiments. During read operation, BL and BLB are set to an intermediate voltage level (i.e., a voltage level between power supply Vcc and ground), according to some embodiments of the disclosure.

FIG. 1B illustrates truth Table 120 of the complementary MTJ memory bit-cell 100 of FIG. 1A. It is pointed out that those elements of FIG. 1B having the same reference numbers (or names) as the elements of any other figure can operate or function in any manner similar to that described, but are not limited to such.

Truth Table 120 shows four modes—Read, Write-0, Write-1, and Retention modes. In the first mode, MTJ1 and MTJ2 devices are read differentially by a sense amplifier. The self-referenced configuration of the complementary bit-cell allows for higher read margins than single bit-cells because the self-referenced configuration results in larger voltage or current difference than that achieved by the single bit-cells. In the second mode, a zero (i.e., logic low) is written to the complementary bit-cell 100. For example, MTJ1 device is biased such that the free and pinned magnets of the MTJ1 device have the same magnetization direction (i.e., parallel 'P') while the MTJ2 device is biased such that the free and pinned magnets of the MTJ2 device have opposite magnetization direction (i.e., anti-parallel "AP"). Here, 'P' condition of the MTJ device refers to storing of logic low (i.e., '0), and "AP" condition of the MTJ device refers to storing of logic high (i.e., '1).

In the third mode, a one (i.e., logic high) is written to complementary bit-cell 100. For example, MTJ2 device is biased such that the free and pinned magnets of MTJ2 device have the same magnetization direction (i.e., parallel 'P') while MTJ1 device is biased such that the free and pinned magnets of the MTJ1 device have opposite magnetization direction (i.e., anti-parallel "AP"). A logic high is written to the MTJ1 device by asserting the WL (i.e., WL=1), asserting the BL (i.e., BL=1 and BLB=0), and de-asserting the SL (i.e., SL=0 and SLB=1). In the second and third modes, MTJ1 and MTJ2 devices are set to opposite values for the write operation.

In the fourth mode, complementary bit-cell 100 retains its magnetic conditions. Previously, MTJ based bit-cell was treated as a nonvolatile flash-like memory and data loss was not considered an issue. However, recent studies suggest that MTJ based bit cells suffer from random bit flip due to thermal excitation against the spin potential barrier. During retention mode, it is possible that MTJ1 device or MTJ2 device or both devices can flip their values (i.e., the magnetization direction of the free magnet layer may change).

FIG. 2 illustrates Table 200 with possible states of complementary MTJ memory-cell 100 for storing '0 and '1 and their probabilities with a given MTJ failure probability. It is pointed out that those elements of FIG. 2 having the same reference numbers (or names) as the elements of any other figure can operate or function in any manner similar to that described, but are not limited to such.

The first column (from the left) is the initial state of the memory cell (e.g., whether complementary bit-cell 100 has an initial value of '0 or '1). For example, when MTJ1 device is conditioned in parallel state and MTJ2 device is conditioned in anti-parallel state, complementary bit-cell 100 stores a logic zero. Likewise, when MTJ2 device is conditioned in parallel state and MTJ1 device is conditioned in anti-parallel state, complementary bit-cell 100 stores a logic one.

The second column (from the left) is the possible temporary state of the memory cell. In some cases, the magnetization direction of the free magnet layer may switch relative to the initial condition causing the stored value to flip. The third column from the left is the probability of this temporary state. For example, 'p' is the probability that bit-cell 100 is flipping, and (1-p) is the probability that bit-cell 100 is not flipping (i.e., retaining its initially stored value).

Writing a binary '0 or '1 (i.e., a logic low a logic high, respectively) into complementary MTJ bit-cell 100 typically involves driving an applied current through, or voltage across, the resistive element in the cell (here, the MTJ device) to force it into a higher-resistivity or a lower-resistivity state (e.g., by means of spin transfer torque with STT-MRAM, heating with PCM, metal migration with ReRAM, or metal ion flow with CBRAM).

The fourth column (from the left) is the value read from complementary MTJ bit-cell 100. Here, the shaded boxes identify the undefined or incorrect read values while the unshaded boxes identify the correct read values.

Table 200 illustrates three cases. In the first case, when one of the MTJ devices (of complementary MTJ bit-cell 100) fails, the output can be incorrect as shown by the shaded boxes in the last column (i.e., the right most column). In the second case, when both MTJ devices fail, the output is wrong (i.e., incorrect). Note that, the probability of both bit cells failing is much lower than one MTJ device in a bit cell failing. For example, assume 'p' equals to 1E-3, which is pretty large as a bit failure rate, then the probability of having either one of the MTJ devices in their respective bit cells failing is about 2E-3, and the probability for both MTJ devices in their respective bit cell failing is 1E-6, which is orders of magnitudes lower and negligible. Hence, by identifying and correcting the undefined values, in some embodiments, the failure probability of the MTJ read operation is reduced.

FIG. 3 illustrates high level memory architecture 300 to detect single flip-error in a complementary resistive memory, according to some embodiments of the disclosure. It is pointed out that those elements of FIG. 3 having the same reference numbers (or names) as the elements of any other figure can operate or function in any manner similar to that described, but are not limited to such.

In some embodiments, architecture 300 comprises an array of Complementary Resistive Memory bit-cells 301, Access Devices 302, First Sense Amplifier (SA) 303, Write Drivers 304, Second SA 305, and Detector 306. Examples of resistive memories include MTJ based memories, Phase-Change-Memory (PCM), Magnetic Random Access Memory (MRAM), resistive RAM (ReRAM) and conductive bridging RAM (CBRAM). So as not to obscure the various embodiments, Complementary Resistive Memory 201 is formed of MTJ devices such as complementary bit-cell 100. However, the embodiments are not limited to such and other types of resistive memories can be used instead.

In some embodiments, Access Devices 302 are intermediary devices for selectively coupling a column of complementary bit-cells to First and Second SAs 303 and 305, respectively. As such, in some embodiments, when a complementary bit-cell is selected by the associated WL and BL settings, Access Devices 302 couple that complementary bit-cell to First and Second SAs 303 and 305, respectively.

In some embodiments, First SA 303 is a differential amplifier that senses or reads bit values stored in MTJ1 and MTJ2 based bit-cells of a selected complementary bit-cell in Complementary Resistive Memory 301. In some embodiments, the output of First SA 303 is a differential output which is collectively shown as Read Out. In some embodiments, Second SA 305 simultaneously reads the BL and BLB for the selected complementary bit-cell in Complementary Resistive Memory 301 to determine whether First SA 303 successfully senses the values stored in the MTJ1 and MTJ2 devices and whether any of the MTJ1 and MTJ2 bit-cells flipped.

In some embodiments, Detector 306 compares the output (Vout and Voutb) of Second SA 305 to determine whether a single bit flip happened at the selected complementary bit-cell in Complementary Resistive Memory 301. In some embodiments, after the error detection by Detector 306 (e.g., an Exclusive NOR gate (XNOR)), the incorrect data can be corrected. The output of Detector 306 is Detector Out. For example, the data can be re-written in the selected complementary bit-cell in Complementary Resistive Memory 301 using a refresh operation. In some embodiments, the re-write operation is performed even though the memory array output data was correct accidentally. In some embodiments, the error correction scheme applies an errors-and-erasures decoding process with information about the location of the error. As such, in some embodiments, the error correction scheme has a higher chance of fixing the codeword which got corrupted by the flipping of at least one of the MTJ devices in the complementary bit-cell.

Figure 4:
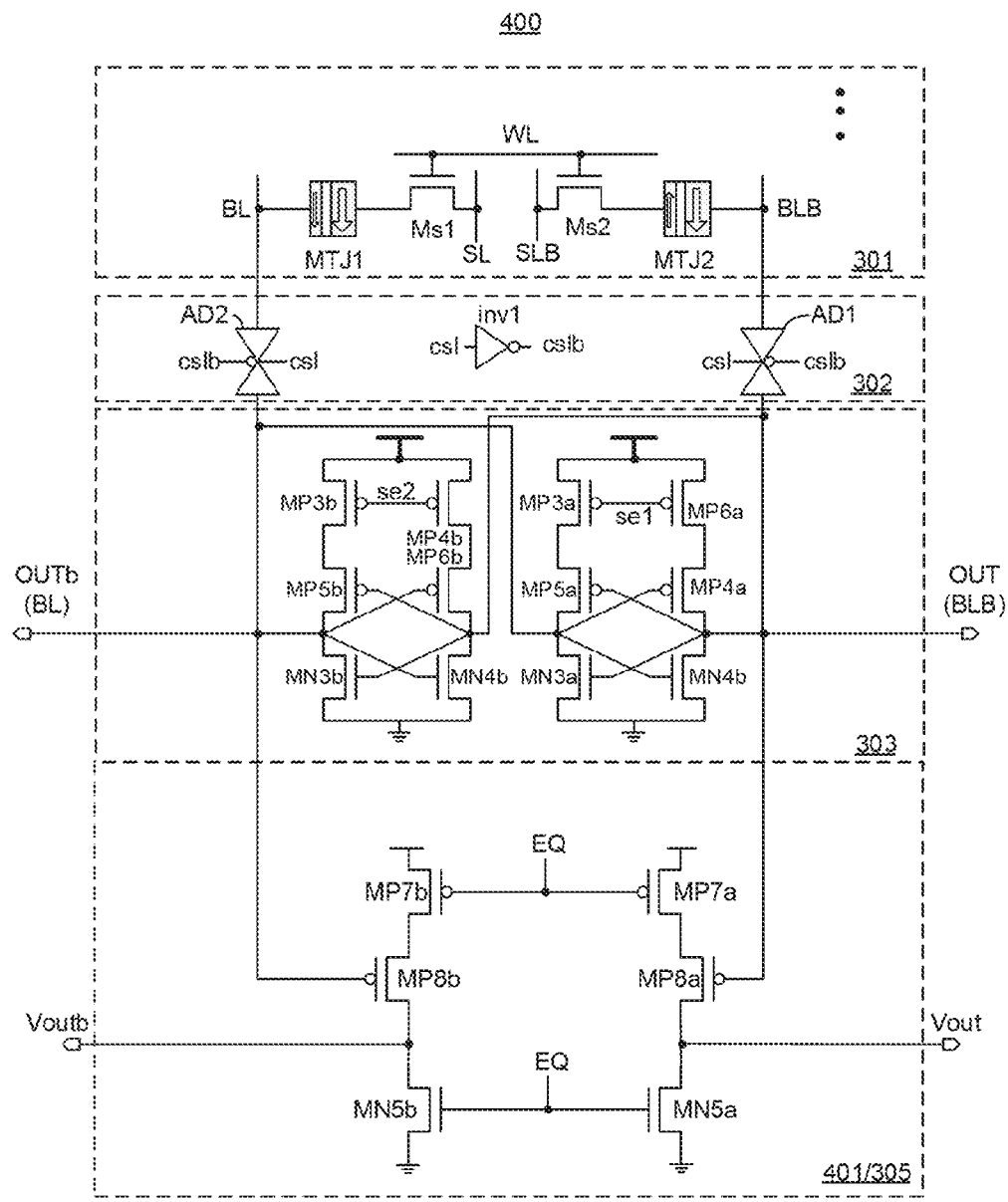
FIG. 4 illustrates a circuit level memory architecture to detect single flip-error in a complementary resistive memory, according to some embodiments of the disclosure.

FIG. 4 illustrates circuit level memory architecture 400 to detect single flip-error in a complementary resistive memory, according to some embodiments of the disclosure. It is pointed out that those elements of FIG. 4 having the same reference numbers (or names) as the elements of any other figure can operate or function in any manner similar to that described, but are not limited to such.

Here, one complementary MTJ bit-cell 301 (same as MTJ bit-cell 100) is shown, which is part of Complementary Resistive Memory 301. In some embodiments, Access Devices (AD) 302 include first Access Device AD1 and second Access Device AD2. In some embodiments, AD1 and AD2 are implemented as pass-gates (e.g., transmission gates) controllable by csl (i.e., column select line) and cslb signals, where cslb is a complementary signal of csl and may be generated by inverter inv1. In some embodiments, AD1 is coupled to BLB at one end and First and Second SAs 303 and 305 at another end. In some embodiments, AD2 is coupled to BL at one end and First and Second SAs 303 and 305 at another end.

In some embodiments, First SA 303 is a differential amplifier which, when enabled to read complementary MTJ bit-cell 301, couples to BL and BLB via Access Devices AD2 and AD1, respectively. In some embodiments, First SA 303 comprises p-type transistors MP1, MP2, MP3$a$, MP3$b$, MP4$a$, MP4$b$, MP5$a$, and MP5$b$; and n-type transistors MN1, MN2, MN3$a$, MN3$b$, MN4$a$, and MN4$b$ coupled together as shown. In other embodiments, other types of amplifier designs may be used to sense outputs on BL and BLB. In some embodiments, the output of First SA 303 is a differential output OUT and OUTb. While the embodiment of FIG. 4 is described with reference to a twin SA design, other types of designs may be used to implement First SA 303. For example, in some embodiments, First SA 303 is a Single SA. A Single SA implementation can reduce circuit size and thus die penalty.

Here, signal names and node names are interchangeably used. For example, the term OUT is used to refer to signal OUT or node OUT depending on the context of the sentence. Here, nodes se1 and se2 receive First SA 303 enable signals se1 and se2, respectively. In some embodiments, se1 and se2 can be coupled to the same signal 'se' sense-enable. In some embodiments, when se=0, the outputs OUT and OUTb are pre-charged and when se=1, the outputs OUT and OUTb are discharged to '0' or remain as '1' depending on the input values to First SA 303.

In some embodiments, Second SA 401/305 comprises p-type transistors MP7a, MP7b, MP8a, and MP8b, and n-type transistors MN5a and MN5b coupled together as shown. In some embodiments, gate terminals of transistors MP7a, MP7b, MN5a, and MN5b are controllable by a control signal (also referred to as the equalize signal "EQ"). In some embodiments, BL and BLB are also input to the gate terminals of transistors MP8b and MP8a, respectively. As such, Second SA 401/305 senses BL and BLB simultaneously as First SA 303 senses BL and BLB.

In some embodiments, at stand-by state, the equalize signal "EQ" is logic high. A logic high on the EQ node causes transistors MP7a and MP7b to turn off and so no current flows from the power supply node for Second SA 401/305. Here labels for nodes and signals are interchangeably used. For example. EQ may refer to signal EQ or node EQ depending on the context of the sentence. When EQ is logic high, transistors MN5a and MN5b turn on to cause the output nodes Vout and Voutb to discharge to ground. Table 3 shows a cases for proper functioning bit-cells and the ones in which bit-cells are flipped.

TABLE 3

Bit-cell flip/data fail probability

| Bit-Cell1 state | Bit-Cell2 state | BL (V) | BLB (V) | Vout | Voutb | Detector Out XNOR as Detector 306 |
|---|---|---|---|---|---|---|
| 1 | AP | P | 0 | Vcc | Vcc | 0 | 1 |
| 2 | P | AP | Vcc | 0 | 0 | Vcc | 1 |
| 3 | AP | AP | −V | −V | Vcc | Vcc | 0 |
| 4 | P | P | +V | +V | Vcc | Vcc | 0 |

The first row of Table 3 shows the case where the two MTJs have complementary states (i.e., AP/P). In this example, True data is AP and bit-cell 1 is conditioned as AP while bit-cell 2 is conditioned as P. The second row of Table 3 shows the bit flip case in which both bit-cell 1 and bit-cell 2 bits are flipped simultaneously and accidentally. The third row of Table 3 shows the bit flip case in which bit-cell 2 bit is flipped. The fourth row of Table 3 shows the bit flip case in which bit-cell 1 bit is flipped.

After First SA 303 senses and amplifies within a pre-determined read period, the voltage on nodes BL and BLB charge to complete 'H' or 'L' status (i.e., Vcc or ground, respectively). And then, the signal "EQ" turns off (i.e., becomes logic low) to turn on Vcc supply from transistors MP7a and MP7b. A logic low EQ also turns off transistors MN5a and MN5b, and thus disconnects the path to ground. According to the input voltages on BL and BLB nodes, transistors MP8a and MP8b turn on at one side and turn off at another side. For example, if the voltage on the BL is high, then the transistor MP8b turns off while the transistor MP8a turns on because the voltage on the BLB node, under normal write conditions, is complementary to the voltage on the BL node. This condition makes the two output nodes Vout and Voutb to become complementary.

In some embodiments, Vout and Voutb are input to Detector 306 (e.g., XNOR). Output of Detector 306 is Detector Out. In some embodiments, if the twin cell status is complement, XNOR output becomes logic '1' or else it is logic '0'. The probability that two bit cells of a complementary resistive bit-cell flip at the same time for the same unit cell is generally small with probability $p^2$ as described in Table. 2.

The cases in the third and fourth rows get the single bit flip at only one of two MTJ based bit cells, which is why the complementary resistive memory bit-cell status for the third and fourth rows becomes AP/AP and P/P, respectively. Physically, or statistically, the resistance values of the two MTJ devices are not completely the same but the difference is within the process variation range. However, as far as sensing by first SA 303 is concerned, the resistances sensed are almost the same even when the MTJ devices have slightly different resistances for the same state. For example, the resistance of MTJ1 device may be slightly higher than the resistance of MTJ2 device even when both tunneling junctions have the same magnetization directions for their respective free magnet layers.

In this case, First SA 303 may not detect the fine resistance difference at all and the voltage level at the BL and BLB nodes is substantially the same as the intermediate level between Vcc and ground during the pre-determined read period. In some embodiments, these intermediate and almost same voltages are delivered to Second SA 401/305. In some embodiments, the intermediate level inputs turns on the transistors MP8a and MP8b slightly, and both output nodes Vout and Voutb are eventually charged to Vcc. When both the nodes Vout and Voutb are high, the output "Detector Out" of Detector 306 (in this example, and XNOR gate) is logic '0'.

In some embodiments, the output "Detector Out" indicates whether a single bit flip happened at the unit memory cell. In some embodiments, after the error detection by Detector 306, correct data is re-written back to complementary resistive bit-cell 100 even though the array output data was correct accidentally. As such, Second SA 401/305 and the read sequence can eliminate the time and power consuming "Salvage Mode" of existing systems resulting in simpler, faster, and lower power. In some embodiments, Second SA 401/305 can also improve the reliability and assist with the error correction process. The embodiments can be described with the following 8-bit example illustrated in Table 4.

TABLE 4

8-bit example with Bit 5 flipping

| Complementary resistive memory bit-cell No. | Bit7 | Bit6 | Bit5 | Bit4 | Bit3 | Bit2 | Bit1 | Bit0 |
|---|---|---|---|---|---|---|---|---|
| MTJ1-MTJ2 | P-AP | P-AP | P-P | P-AP | P-AP | P-AP | P-AP | P-AP |
| First SA 303 | 0 | 0 | 0 or 1 | 0 | 0 | 0 | 0 | 0 |
| Second SA 401/305 | 1 | 1 | 0 | 1 | 1 | 1 | 1 | 1 |

In this example, the initial written values are all "P-AP" or logic-0. Continuing with the example, during the read operation, one of the MTJs in Bit5 flips, so Bit5 becomes an undefined "P-P" condition. The output from First SA 303 may have two possible outcomes; "00000000" or "00100000", where the bold and underlined number indicates the two possible states for that bit. For the second outcome, "00100000", the Error Correction Code (ECC) detects and corrects the error. In some cases, if it happens to be the first outcome "00000000", the ECC (error correction code) may not detect any error, and so no write-back will be operated and the corrupted Bit5 is left as it is. In some cases, if there is any future failure in other bits, the error could become uncorrectable (i.e., silent error accumulation).

In some embodiments, Second SA 401/305 is designed to avoid such silent error accumulation. In some embodiments, Second SA 401/305 detects the non-complementary cell values in Bit5 and provides a confident signal that there may be a problem associated with this bit. After the read operation, ECC is involved, and even if there is no error to correct (i.e., the First SA read is "00000000"), the correct value is forced to write back according to some embodiments. As such, the P-P situation is recovered.

Figure 5:
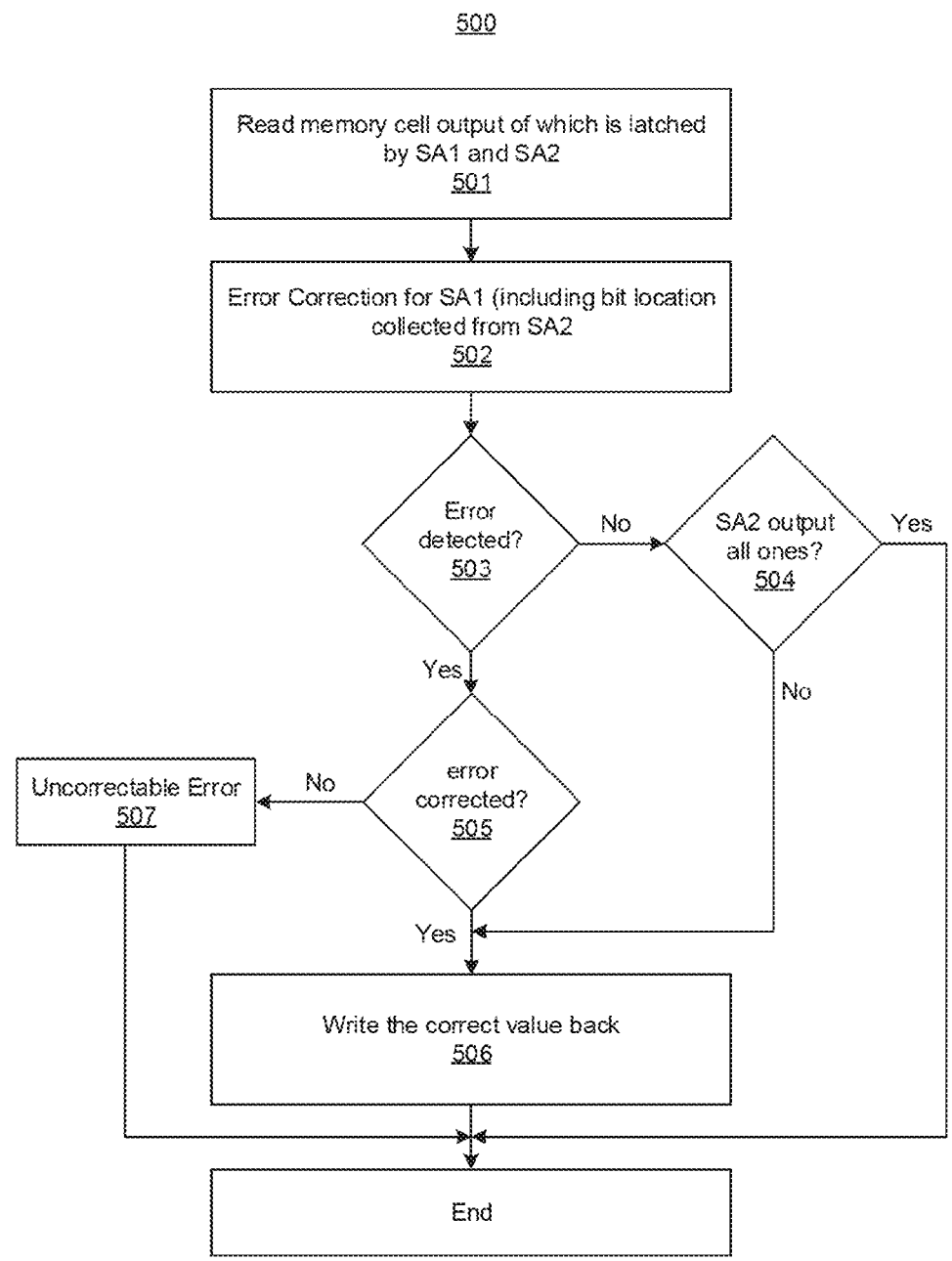
FIG. 5 illustrates a flowchart of a method to detect and correct single/double flip-error(s) in a complementary resistive memory, according to some embodiments.

FIG. 5 illustrates flowchart 500 of a method to detect and correct single/double flip-error in a complementary resistive memory, according to some embodiments. It is pointed out that those elements of FIG. 5 having the same reference numbers (or names) as the elements of any other figure can operate or function in any manner similar to that described, but are not limited to such.

Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 501, STT-RAM array 301 is read and two sets of outputs are analyzed. The first set of outputs (OUT and OUTb) are from First SA 303, and the second set of outputs are from Second SA 401/305. In some embodiments, the outputs from First SA 303 are processed by an error correction scheme. The error correction code may have errors due to a possible flip in the MTJ bit cells.

At block 502, error correction is performed at the output of First SA 303. At the same time, Second SA 401/305 provides information such as which bit may potentially have an error. The output of Second SA 401/305 also identifies the location of that bit. As such, the location of the error is known. In some embodiments, the known error locations when provided to the error correction scheme for errors-and-erasures decoding, the same error correction code may correct more number of bits than errors only decoding without the location information.

At block 503, a determination is made whether an error is detected. If an error is detected in the error correction code (e.g., by checking the syndrome), then the process proceeds to block 505, or else the process proceeds to block 504. At block 505, a determination is made whether the error (which was detected at block 503) is corrected. If the error is corrected (e.g., by traditional error correction schemes), the process proceeds to block 506, or else the process proceeds to block 507. At block 506, the correct value is written back to the complementary resistive memory bit-cell that was identified to have an error (e.g., due to one of the bits flipping). The process then ends.

At block 507, a machine check is involved because the error is not correctable. The process then ends. At block 504, a determination is made whether the output Detector Out of Detector 306 (which processes the output of Second SA 401/305) are all ones. While various embodiments detect for all ones as an indication of error (i.e., flip in a bit-cell), other indicators may be used depending on the type or implementation of Detector 306. In this example, Detector 306 is an XNOR gate. Here, Detector Out of Detector 306 is a 1 bit output. In some embodiments, a plurality of Detectors 306 (i.e., one associated with each SA) are used that provide a plurality of output bits. These output bits are checked at block 504, according to some embodiments.

If the output of the plurality of Detectors 306 is not all ones (i.e., at least one output of one Detector 306 is zero), then the process proceeds to block 506, where the correct value is reinforced back to the complementary bit-cell that passed the error correction scheme based on the outputs of First SA 303 but failed the test from Second SA 401/305. If the output of the plurality of Detectors 306 are all ones, then Second SA confirms that there is indeed no error, and the proceed ends.

In some embodiments, the program software code/instructions associated with flowchart 500 are stored in a computer executable storage medium and executed by a terminal device. Here, computer executable storage medium is a tangible machine readable medium that can be used to store program software code/instructions and data that, when executed by a computing device, causes one or more processors to perform a method(s) as may be recited in one or more accompanying claims directed to the disclosed subject matter.

The tangible machine readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer to peer networks and the like, including the Internet. Different portions of the software program code/instructions and data can be obtained at different times and in different communication sessions or in the same communication session.

The software program code/instructions (associated with flowchart 500) and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine readable medium in entirety at a particular instance of time.

Examples of tangible computer-readable media include but are not limited to recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

In general, a tangible machine readable medium includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, Blackberry® Droid®, or the like, or any other device including a computing device. In one embodiment, processor-based system is in a form of or included within a PDA, a cellular phone, a notebook computer, a tablet, a game console, a set top box, an embedded system, a TV, a personal desktop computer, etc. Alternatively, the traditional communication applications and subsidized application(s) may be used in some embodiments of the disclosed subject matter.

Figure 6:
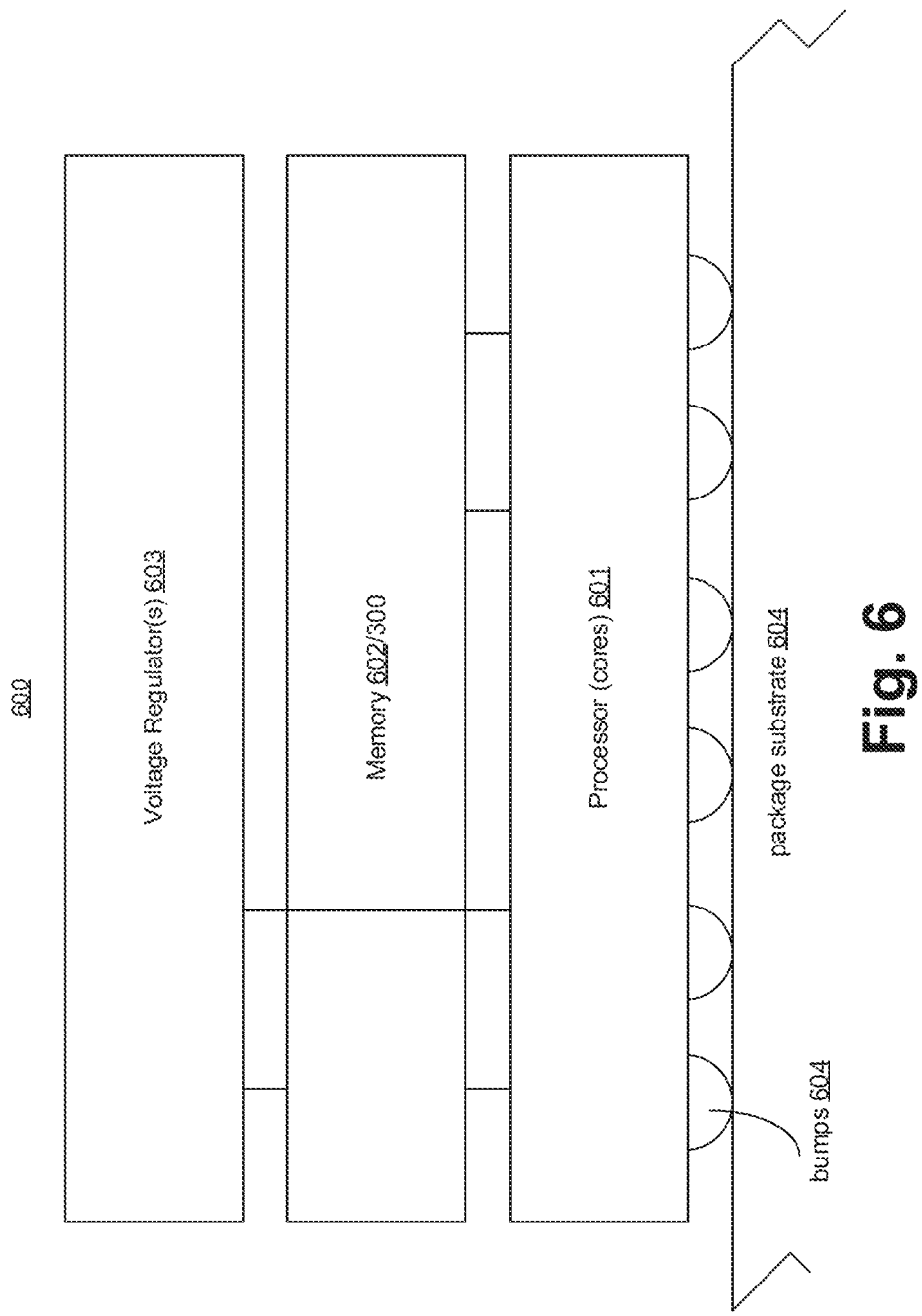
FIG. 6 illustrates a three dimensional (3D) integrated circuit (IC) having a memory architecture to detect and correct single/double flip-error(s) in a complementary resistive memory, according to some embodiments of the disclosure.

FIG. 6 illustrates a three dimensional (3D) integrated circuit (IC) 600 having memory architecture to detect and correct single/correct flip-error in a complementary resistive memory, according to some embodiments of the disclosure. It is pointed out that those elements of FIG. 6 having the same reference numbers (or names) as the elements of any other figure can operate or function in any manner similar to that described, but are not limited to such.

In some embodiments, 3D IC 600 comprises Processor die 601 having one or more processor cores, Memory die 602 (e.g., memory architecture 300 with apparatus to detect and correct single/double flip-error in a complementary resistive memory), Voltage Regulator(s) die 603, bumps 604 for coupling Processor die 601 to package substrate 604. 3D IC 600 may have more or fewer dies shown packaged together in a single package. For example, a communications die having an integrated antenna may also be coupled to one of the dies in 3D IC 600. The order of the dies may be different for different embodiments. For example, Voltage Regulator(s) 603 may be sandwiched between Memory die 602 and Processor die 601.

Figure 7:
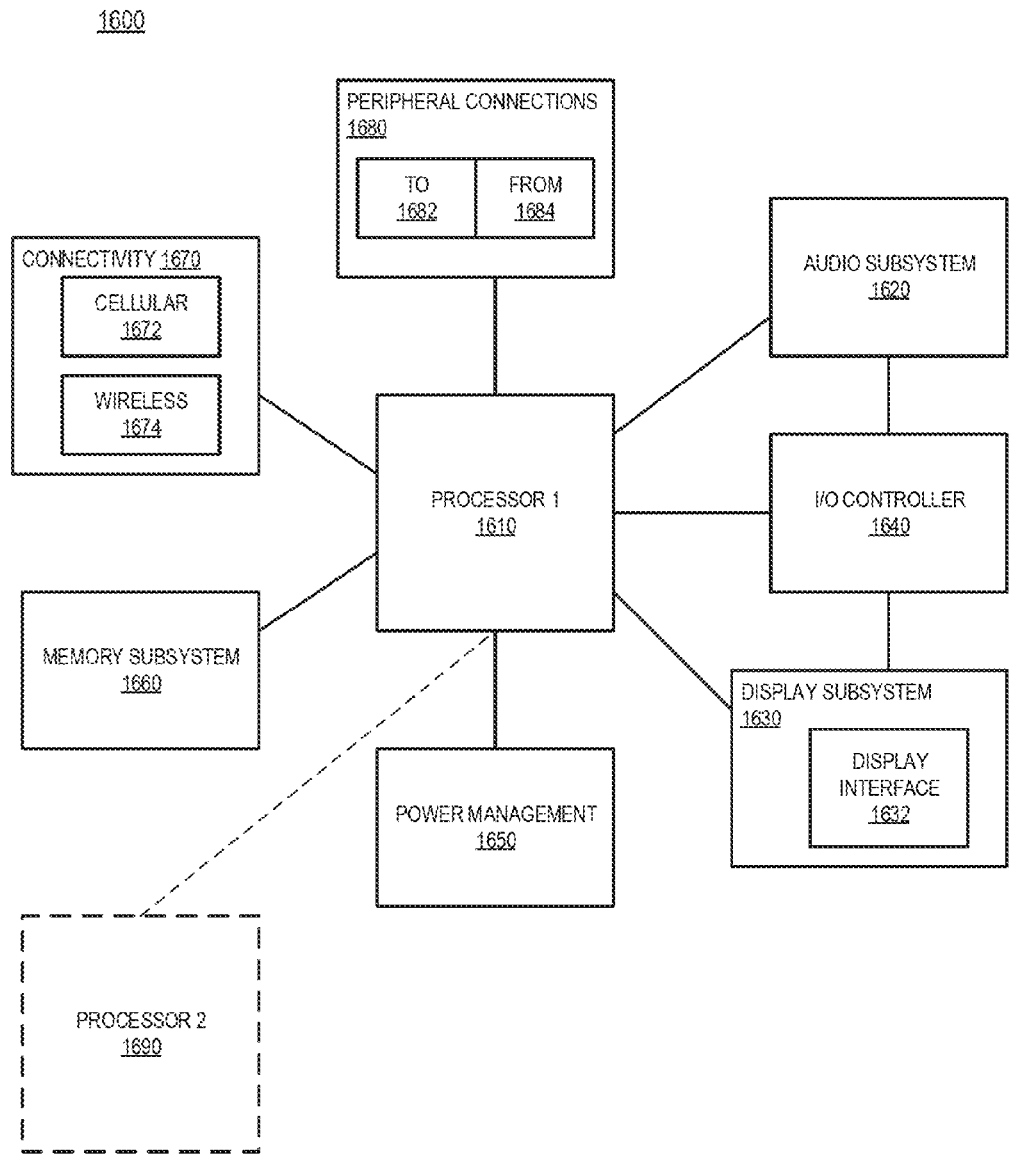
FIG. 7 illustrates a smart device or a computer system or a SoC (System-on-Chip) with memory architecture to detect and correct single/double flip-error(s) in a complementary resistive memory, according to some embodiments.

FIG. 7 illustrates a smart device or a computer system or a SoC (System-on-Chip) with memory architecture to detect and correct single/double flip-error(s) in a complementary resistive memory, according to some embodiments. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with memory architecture to detect and correct single/double flip-error(s) in a complementary resistive memory, according to some embodiments discussed. Other blocks of the computing device 1600 may also include memory to detect and correct single/double flip-error(s) in a complementary resistive memory, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. In some embodiments, Memory subsystem 1660 comprises memory architecture 300 to detect and correct single/double flip-error in a complementary resistive memory. In some embodiments, Memory subsystem 1660 includes memory architecture to detect and correct single/double flip-error(s) in a complementary resistive memory, according to some embodiments. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a complementary resistive memory bit-cell; a first sense amplifier coupled to the complementary resistive memory bit-cell via access devices; and a second sense amplifier coupled to the first sense amplifier and to the complementary resistive memory bit-cell via the access devices, wherein the second sense amplifier is operable to detect an error in the complementary resistive memory bit-cell.

In some embodiments, the second sense amplifier is operable to output a pre-determined value when any of the memory bit-cells in the complementary resistive memory bit-cell flips. In some embodiments, the apparatus comprises a detector coupled to the second sense amplifier, the detector to process the output of the second sense amplifier, and wherein an output of the detector indicates a location of an error in a memory array having the complementary resistive memory bit-cell. In some embodiments, the apparatus comprises a correction logic to apply errors-and-erasures decoding.

In some embodiments, the detector is an exclusive-NOR (XNOR) logic gate. In some embodiments, the memory is at least one of: a magnetic random access memory (MRAM); or a Phase Change Memory (PCM). In some embodiments, the second amplifier comprises: a first p-type transistor coupled to a power supply and controllable by a control signal; and a second p-type transistor coupled to the power supply and controllable by the control signal.

In some embodiments, the second amplifier comprises: a third p-type transistor coupled in series with the first p-type transistor, and wherein the third p-type transistor has a gate terminal coupled to one of the access devices that further couples to a bit-line. In some embodiments, the second amplifier comprises: a fourth p-type transistor coupled in series with the second p-type transistor, and wherein the fourth p-type transistor has a gate terminal coupled to one of the access devices that further couples to a complementary bit-line.

In some embodiments, the second amplifier comprises: a first n-type transistor coupled in series with the third p-type transistor and to ground and controllable by the control signal; and a second n-type transistor coupled in series with the fourth p-type transistor and to the ground and controllable by the control signal. In some embodiments, the complementary resistive memory bit-cell comprises at least one of a magnetic tunneling junction (MTJ) device; a phase change memory (PCM) cell; or a resistive random access memory (ReRAM) cell.

In another example, a system is provided which comprises: a processor; a memory coupled to the processor, the memory including apparatus according the apparatus described above; and a wireless interface for allowing the processor to communicate with another device.

In another example, a system is provided which comprises: a processor; a memory coupled to the processor, the memory including: an array of complementary resistive memory bit-cells; a first sense amplifier coupled to at least one of the complementary resistive memory bit-cells of the array via access devices; and a second sense amplifier coupled to the first sense amplifier and to the at least one of the complementary resistive memory bit-cells via the access devices, wherein the second sense amplifier is operable to output a pre-determined value when any of the memory bit-cells in the at least one complementary resistive memory bit-cell flips; and a wireless interface for allowing the processor to communicate with another device.

In some embodiments, the processor and the memory are integrated in a three dimensional stacked integrated circuit. In some embodiments, the processor comprises a correction logic to apply an errors-and-erasures decoding. In some embodiments, the memory comprises a detector coupled to the second sense amplifier, wherein the detector to process the output of the second sense amplifier, and wherein an output of the detector indicates a location of an error in the array. In some embodiments, the detector is an exclusive-NOR (XNOR) logic gate.

In some embodiments, the memory is at least one of: a magnetic random access memory (MRAM); or a Phase Change Memory (PCM). In some embodiments, the complementary resistive memory bit-cell comprises at least one of: a magnetic tunneling junction (MTJ) device; a phase change memory (PCM) cell; or a resistive random access memory (ReRAM) cell.

In another example, a method is provided which comprises: reading an array of complementary resistive memory bit-cells; providing an output of a first sense amplifier which is coupled to the array via access devices; providing an output of a second sense amplifier which is coupled to the first sense amplifier and to the array via the access devices; and identifying a location of error by processing the output generated by the second amplifier.

In some embodiments, the method comprises: performing errors-and-erasures decoding, on the output generated by the first sense amplifier, by applying the identified location of the error in the array. In some embodiments, the method comprises performing error correction on the output generated by the first sense amplifier. In some embodiments, the method comprises determining whether an error is detected in response to performing the error correction. In some embodiments, the method comprises: correcting the error to generate a correct value; and writing the correct value back to the array. In some embodiments, the method comprises: correcting the error in the identified location of the array. In some embodiments, the error is corrected by performing a refresh operation.

In another example, an apparatus is provided which comprises: means for reading an array of complementary resistive memory bit-cells; means for providing an output of a first sense amplifier which is coupled to the array via access devices; means for providing an output of a second sense amplifier which is coupled to the first sense amplifier and to the array via the access devices; and means for identifying a location of error by processing the output generated by the second amplifier.

In some embodiments, the apparatus comprises: means for performing errors-and-erasures decoding, on the output generated by the first sense amplifier, by applying the identified location of the error in the array. In some embodiments, the apparatus comprises means for performing error correction on the output generated by the first sense amplifier. In some embodiments, the apparatus comprises means for determining whether an error is detected in response to performing the error correction.

In some embodiments, the apparatus comprises: means for correcting the error to generate a correct value; and means for writing the correct value back to the array. In some embodiments, the apparatus comprises means for correcting the error in the identified location of the array. In some embodiments, the error is corrected by performing a refresh operation.

In another example, a system is provided which comprises: a processor; a memory coupled to the processor, the memory including apparatus according the apparatus described above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first circuitry to read an output of first and second resistive memory bit-cells;
   a second circuitry, separate from the first circuitry, to read an output of the first and second resistive memory bit-cells, wherein the second resistive memory bit-cell is complementary to the first resistive memory bit-cell;
   a third circuitry to perform an error correction on the output read by the first circuitry; and
   a fourth circuitry to determine an error in the output read by the first circuitry according to an output read from the second circuitry.

2. The apparatus of claim 1, wherein the fourth circuitry is to determine an error by checking a syndrome.

3. The apparatus of claim 1 comprises a fifth circuitry to write back correct value to the first and second resistive memory bit-cells.

4. The apparatus of claim 1, wherein the first circuitry comprises a first sense amplifier.

5. The apparatus of claim 4, wherein the second circuitry comprises a second sense amplifier.

6. The apparatus of claim 5, wherein the second sense amplifier comprises fewer transistors than the first sensor amplifier.

7. The apparatus of claim 1, wherein the first and second resistive memory cells include at least one of: a magnetic junction, a phase change memory cell; or a resistive random access memory cell.

8. An apparatus comprising:
   first circuitry for reading an array of complementary resistive memory bit-cells;
   second circuitry communicatively coupled to the first circuitry, the second circuitry for providing an output of a first sense amplifier which is coupled to the array via access devices; and
   third circuitry communicatively coupled to the second circuitry, the third circuitry for providing an output of a second sense amplifier which is coupled to the first sense amplifier and to the array via the access devices.

9. The apparatus of claim 8 comprises fourth circuitry for identifying a location of error by processing the output generated by the second sense amplifier.

10. The apparatus of claim 9, comprises fifth circuitry to perform errors-and-erasures decoding on the output generated by the first sense amplifier, wherein the fifth circuitry is to apply the identified location of the error in the array.

11. The apparatus of claim 8, wherein the array of complementary resistive memory bit-cells includes at least one of: a magnetic junction, a phase change memory cell; or a resistive random access memory cell.

12. An apparatus comprising:
   a first sense amplifier to read bit values stored in first and second resistive memory bit-cells, wherein the first and second resistive memory bit cells are complementary bit-cells; and
   a second sense amplifier to simultaneously read bit values stored in the first and second resistive memory bit-cells to determine whether any of the bit values in the first and second resistive memory bit-cells are flipped.

13. The apparatus of claim 12 comprises a first access device coupled to the first resistive memory bit-cell and the second sensor amplifier.

14. The apparatus of claim 12 comprises a second access device coupled to the second resistive memory bit-cell and the second amplifier.

15. The apparatus of claim 12, wherein the second sense amplifier comprises fewer transistors than the first sensor amplifier.

16. The apparatus of claim 12 comprises a detector coupled to the second sense amplifier.

17. The apparatus of claim 16 comprises logic to re-write data back to the first and second resistive memory cells according to an output of the detector.

18. The apparatus of claim 17, wherein the logic is to re-write data during a refresh operation.

19. The apparatus of claim 12, wherein the first and second resistive memory cells include at least one of: a magnetic junction, a phase change memory cell; or a resistive random access memory cell.

* * * * *